(12) United States Patent
Spirer

(10) Patent No.: US 11,031,941 B2
(45) Date of Patent: Jun. 8, 2021

(54) FILTERLESS DIGITAL PHASE-LOCKED LOOP

(71) Applicant: Analog Devices, Inc., Norwood, MA (US)

(72) Inventor: Adam R. Spirer, Westwood, MA (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/870,677

(22) Filed: May 8, 2020

(65) Prior Publication Data

US 2020/0343896 A1 Oct. 29, 2020

Related U.S. Application Data

(63) Continuation of application No. 16/160,103, filed on Oct. 15, 2018, now Pat. No. 10,651,861.

(51) Int. Cl.
  *H03L 7/099* (2006.01)
  *H03L 7/089* (2006.01)

(52) U.S. Cl.
  CPC .......... *H03L 7/0991* (2013.01); *H03L 7/0891* (2013.01)

(58) Field of Classification Search
  CPC .... H03D 3/24; H03L 7/06; H03L 7/08; H03L 7/089; H03L 7/091; H03L 7/093; H03L 7/187; H03L 7/0891; H03L 7/0991; H04L 7/00; H04L 7/033; H04W 88/02
  USPC ........ 327/147, 150, 156, 157; 375/327, 354, 375/355, 375, 376; 455/256, 260, 265
  See application file for complete search history.

(56) References Cited

U.S. PATENT DOCUMENTS

| | | | | |
|---|---|---|---|---|
| 6,901,039 | B1 * | 5/2005 | Sugie | G11B 7/00456 369/47.28 |
| 8,050,376 | B2 * | 11/2011 | Liu | H03L 7/10 375/376 |
| 8,508,266 | B2 | 8/2013 | Frantzeskakis et al. | |
| 10,651,861 | B2 * | 5/2020 | Spirer | H03L 7/0991 |
| 2006/0267640 | A1 * | 11/2006 | Travis | H03L 7/10 327/105 |
| 2007/0092040 | A1 * | 4/2007 | Higashino | H04L 7/0029 375/327 |

(Continued)

OTHER PUBLICATIONS

Office Action mailed in TW Application Serial No. 108136789 dated May 22, 2020, 11 pages.

(Continued)

*Primary Examiner* — Shawkat M Ali
(74) *Attorney, Agent, or Firm* — Patent Capital Group

(57) ABSTRACT

There is disclosed in one example a digital phase-locked loop (DPLL) circuit adapted to avoid loop-bandwidth tradeoff, the circuit including: a frequency dimension frequency detector having an external frequency input and a feedback frequency input, the frequency dimension frequency detector including circuitry to measure a frequency difference between the external frequency input and the feedback frequency input and to drive an impulse signal, wherein the impulse signal is of a first species if the difference is positive and of a second species if the difference is negative; and a number-controlled oscillator (NCO) including circuitry to drive an output clock and to adjust the frequency of the output clock responsive to the impulse signal, wherein an output of the NCO provides the feedback frequency input of the frequency dimension frequency detector.

20 Claims, 11 Drawing Sheets

(56) References Cited

U.S. PATENT DOCUMENTS

2010/0111241 A1\* 5/2010 Kesterson ............... H03L 7/085
 375/376
2011/0309867 A1\* 12/2011 Choi ...................... H03L 7/113
 327/157
2012/0313676 A1\* 12/2012 Nguyen ................ H03L 7/0991
 327/156

OTHER PUBLICATIONS

EN Translation of Office Action mailed in TW Application Serial No. 108136789, 8 pages.

\* cited by examiner

FILTERLESS DIGITAL PHASE-LOCKED LOOP

PRIORITY DATA

This application is a continuation of U.S. patent application Ser. No. 16/160,103, filed Oct. 15, 2018, entitled, "FILTERLESS DIGITAL PHASE-LOCKED LOOP, which is hereby incorporated by reference in its entirety.

TECHNICAL FIELD OF THE DISCLOSURE

This application relates to the field of audio signal processing, and more particularly to providing a filterless digital phase-locked loop.

BACKGROUND

Consumers of audio products expect high quality audio and linear response from audio processing applications.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY

Figure 1:
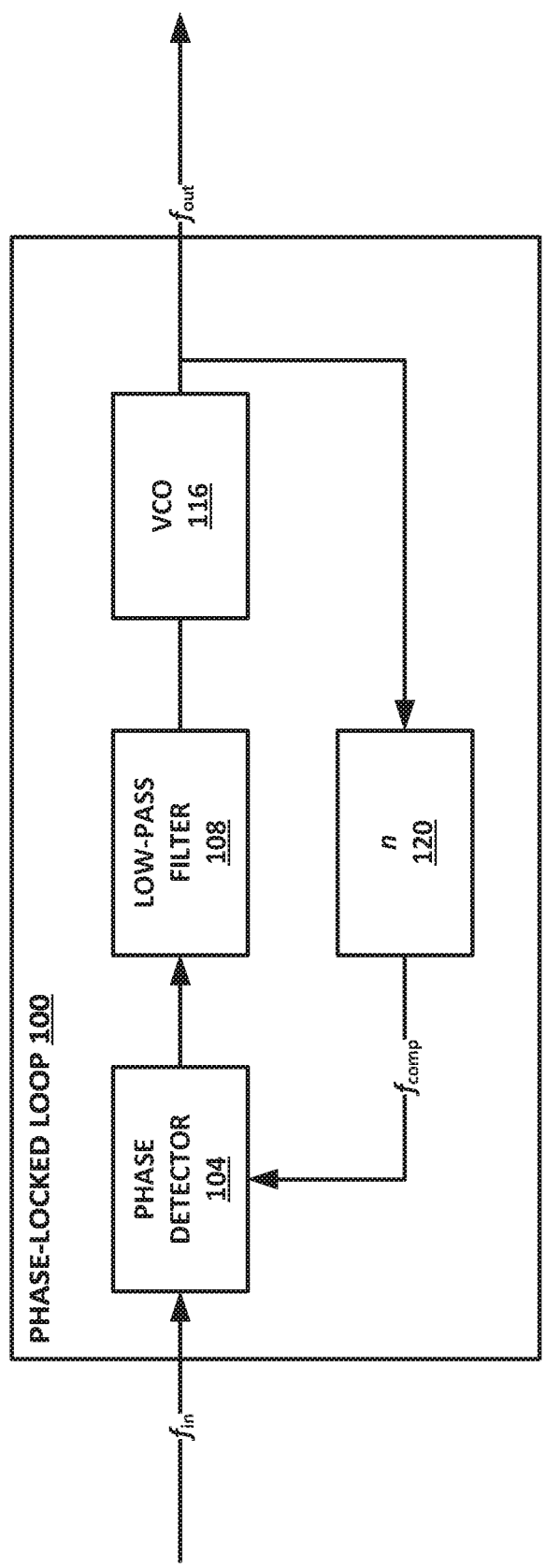
FIG. 1 is a block diagram of a phase-locked loop (PLL), according to the teachings of the present specification.

In an example, there is disclosed a digital phase-locked loop (DPLL) circuit adapted to avoid loop-bandwidth tradeoff, the circuit comprising: a frequency dimension frequency detector having an external frequency input and a feedback frequency input, the frequency dimension frequency detector comprising circuitry to measure a frequency difference between the external frequency input and the feedback frequency input and to drive an impulse signal, wherein the impulse signal is of a first species if the difference is positive and of a second species if the difference is negative; and a number-controlled oscillator (NCO) comprising circuitry to drive an output clock and to adjust the frequency of the output clock responsive to the impulse signal, wherein an output of the NCO provides the feedback frequency input of the frequency dimension frequency detector.

DETAILED DESCRIPTION OF THE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

The phase-locked loop (PLL) is a common and fundamental circuit in signal processing. In signal processing applications, the processing circuit receives an input signal at a particular sampling frequency. This signal is to be processed within the circuit, possibly at a different sampling frequency. Even in cases where the signal processor operates at the same nominal sampling frequency as the input signal, it is possible to have some mismatch in the sampling frequencies, and it is almost inevitable that the signals will be out of phase with one another.

The fundamental purpose of the PLL is to recover the sampling frequency and the phase from the input signal, and to match that sampling frequency—either directly or as a multiple—within the signal processor.

Despite their usefulness, PLLs have been considered, from their inception, to be temperamental circuits with sometimes questionable reliability and consistency. One reason for this is a fundamental design trade-off in PLLs known as the "loop bandwidth trade-off."

In a traditional PLL, the input signal is sampled by a phase frequency detector. This phase frequency detector exists in a closed loop configuration with the output of the PLL. The phase frequency detector measures a phase difference between the input frequency and the output frequency. This phase frequency detector can be used to drive a voltage-controlled oscillator (VCO) which provides the output of the PLL. But in this configuration, both phase and frequency are measured and controlled as a function of a phase measurement. This means that with respect to frequency, there is a dimensional mismatch. Frequency can be derived from phase, but the unit mismatch creates some fundamental difficulties in circuit design.

The classic PLL has an underdamped response. This means that the PLL will quickly zero in on the correct phase and frequency, but will then oscillate slightly, providing a sinusoidal response rather than a flat response. A low-pass filter (LPF) can be disposed between the phase detector and the VCO to damp the sinusoidal output. This filters transients within the loop itself, or in other words, filters out the loop's natural response. The LPF is also used to reject jitter that may be introduced into the output. This filters out minute, high-frequency changes in rate.

A feature of the classic PLL is that it can be adjusted to either be better at rejecting jitter, or to be better at filtering transients within the loop's natural response. These two factors are inversely related. A nonaggressive loop filter will keep loop transients quiet, so that the output oscillates very little over the target phase. The output will still track the input phase sinusoidally, but the sinusoid will be close enough to flat for design purposes. But such nonaggressive filtering leaves the PLL vulnerable to jitter. On the other hand, the PLL can be filtered aggressively, which makes the output very insensitive to jitter. But this aggressive filtering has the side effect of causing the output to oscillate more widely across the input phase. So system designers using a classic PLL are required to find the right "trade-off" between jitter and transient response. As a fundamental limitation of the classic PLL design, one must come at the expense of the other.

The present specification provides a novel filterless digital PLL (DPLL) that employs an frequency detector and an impulse response to control a number-controlled oscillator (NCO). The frequency detector adjusts the frequency of the output by a quantum value by generating impulses in response to the input or the NCO feedback. The degree of adjustment is proportional to the magnitude of the impulse. In other words, the larger the impulse function, the greater the adjustment made by the DPLL at each step. Depending on the timing of the arrival of an edge, the frequency is adjusted either up or down. Advantageously, because the filterless DPLL measures frequency directly in the frequency dimension, it does not suffer from the fundamental limitation of the loop bandwidth trade-off. Rather, both transient response and jitter can be improved by decreasing the magnitude of the impulse function. Rather than being inversely related, they are directly related. A smaller magnitude impulse results in both quieter transient response, and better jitter rejection. The only "trade-off" required for this improved response is a longer lead time to zero in on the desired frequency. But taking an audio digital signal processor (DSP) as an illustrative embodiment, even with a relatively small impulse (yielding a quieter transient response and good jitter rejection) the target frequency can be found in a matter of tens of milliseconds, which is well below the range of human perception. Furthermore, in audio systems, it is uncommon for the input sampling frequency to change midstream. Generally, the audio input signal is sampled at a constant frequency that changes rarely, if ever, over the course of the stream. Thus, in an audio processing application, the DPLL can find the correct frequency quickly enough to not matter to a human user.

Once the DPLL is locked on the correct frequency, it may still be necessary to bring the output clock into phase with the input signal. In some embodiments, this can be accomplished with a phase-adjusted NCO that receives as inputs the output of the DPLL and the input signal itself. But introduction of this phase-adjusted NCO (essentially a phase detector) does not reintroduce into the system the loop bandwidth trade-off. Again, frequency is being measured directly in the frequency dimension, while phase is being measured directly in the phase dimension. Thus, the phase-adjusted NCO simply measures the phase difference between its two input signals (both of which should now be at the same frequency) and adjusts the phase of the NCO output to match the phase of the input frequency. Note that the phase-adjusted NCO can be disposed in an open-loop configuration with respect to the DPLL. In other words, the phase-adjusted NCO does not need to feedback its own output to seek the right phase. Rather, it can merely compute a phase difference between the input frequency and the NCO output frequency.

Overdamped frequency detection can be created in a DPLL loop by detecting the presence of a reference clock compared to the loop's feedback clock, and controlling an integrator based on these clocks using an impulse or incremental change to the integrator speed on an edge-by-edge basis. This is in contrast to a prior art PLL, which may use a continuous exclusive-OR (XOR)-type signal or typical phase frequency detection approach, where an underdamped or oscillating response is created. In other words, the integrator (or digitally controlled oscillator, or counter) has its increment value adjusted by a constant value (either up or down) depending on the presence of an edge on the reference or feedback clocks. The magnitude of this adjustment remains constant, regardless of the phase difference between the two clocks. This makes the loop's own transient response and its external jitter response directly (rather than inversely) correlated, such that adjusting the frequency detector to increase jitter performance also reduces the loop's own transients. Transient performance and external jitter performance may be adjusted by changing the magnitude of the impulse (i.e., the increment value) to the integrator, rather than implementing a loop filter and varying its frequency response.

This loop does not lock to a specified phase offset, but it does asymptotically approach a constant phase offset based on the reference clock frequency's fractional relationship to the internal clock frequency driving the circuit. Because the loop inherently locks to a constant phase offset, a standard phase detector circuit can be added to the loop after the integrator to align the output clock to a specified phase offset without introducing any significant oscillation effects that would otherwise disrupt the loop performance.

Thus, according to embodiments of the present specification, a digital phase-locked loop is implemented using an overdamped frequency detection mechanism, providing the capability of significant jitter rejection and minimal loop transients across a wide range of input frequencies, without the need for a loop filter.

A typical phase frequency detector produces an underdamped response that is suppressed somewhat by the loop filter, along with jitter. The result is one of the following:
1. Phase frequency detector (PFD) gain is very low and/or loop filter is very sharp, causing the loop to oscillate more as the loop more slowly corrects for phase/frequency error.
2. PFD gain is higher and/or loop filter is less aggressive, while transients from larger PFD adjustments become more apparent and more jitter also gets through.

Overall, there must be a balance of these two effects (PFD transients and loop oscillations) since they are inversely related, so that one gets better as the other gets worse, and vice-versa. This is known as the loop bandwidth trade-off.

The DPLL of the present specification includes a frequency detector that overall produces an overdamped response. The NCO approaches frequency alignment asymptotically, with the exception of a very small sample-by-sample NCO adjustment.

Lowering the gain of the frequency detector reduces its own contribution to loop transients. There is, therefore, no loop oscillation, and more jitter is rejected. NCO accuracy can be increased as much as desired by reducing the frequency detector gain without a negative effect on loop performance. The only consequence is increased settling or locking time.

A system and method for providing a filterless digital phase-locked loop will now be described with more particular reference to the attached FIGURES. It should be noted that throughout the FIGURES, certain reference numerals may be repeated to indicate that a particular device or block is wholly or substantially consistent across the FIGURES. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

FIG. 1 is a block diagram of a phase-locked loop (PLL) 100, according to the teachings of the present specification. Phase-locked loop 100 includes certain attributes of existing PLLs, but in some embodiments may be modified with some or all of the teachings of the present specification to improve performance, such as by providing directly correlated jitter rejection and loop bandwidth response. Thus, in various embodiments, phase-locked loop 100 may have certain elements replaced or supplemented, such as by some of the elements disclosed in filterless DPLL 200 of FIG. 2.

Phase-locked loop 100 illustrates the use of a PLL in an application such as a frequency multiplier. However, it should be understood that PLLs have a broad range of applications.

In its simplest form, a PLL such as PLL 100 includes a phase detector (e.g., phase detector 104), a VCO (e.g., VCO 116), an input frequency, and an output frequency. PLLs commonly blend digital and analog techniques in a single circuit.

PLLs such as PLL 100 can be used in many different types of circuits, including frequency multiplication, frequency division, tone decoding, modulation and demodulation of both AM and FM signals, frequency synthesizers, frequency detectors, pulse synchronization, and recovery of data and signals.

Although PLLs have been known for approximately 100 years (and mechanical analogs of PLLs have been known since as early as the 17th century), circuit designers sometimes approach PLLs suspiciously. Many circuit designers consider PLLs to be temperamental circuits with inconsistent response. As previously discussed, this is partly due to a fundamental limitation in traditional PLLs known as the loop bandwidth trade-off.

Fundamentally, phase detector 104 receives input frequency $f_{in}$, and detects a phase difference between $f_{in}$ and an output frequency of VCO 116. VCO 116 feeds back output frequency $f_{out}$ to phase detector 104, and based on the difference in phase, phase detector 104 outputs a signal to VCO 116 to alter the phase and frequency of a crystal oscillator. As $f_{out}$ and $f_{in}$ come more nearly into phase, phase detector 104 adjusts its output voltage, so that VCO 116 begins to match $f_{out}$ to $f_{in}$.

But the traditional PLL design has a fundamental limitation. Frequency $f_{out}$ will not linearly match $f_{in}$, but rather will oscillate slightly back and forth over the target phase while tracking the input phase of $f_{in}$ sinusoidally. This is in part because phase detector 104 is sampling $f_{out}$ in the phase dimension rather than in the frequency dimension. Because the quantities are dimensionally different, phase detector 104 does not provide a precise match between $f_{out}$ and $f_{in}$.

Because frequency is the mathematical derivative of phase, $f_{out}$ will oscillate around the target phase of $f_{in}$.

To provide a more linear output, PLL 100 can include a loop filter such as low-pass filter (LPF) 108. LPF 108 helps to eliminate or filter out the oscillations. This deals with loop transients. LPF 108 also deals with jitter, which can be caused by external disturbance. This filters out minute, high-frequency changes in rate.

PLL 100 also includes a multiplier block 120. Multiplier block 120 may be configured to generate a fixed multiple of $f_{out}$ (composite frequency $f_{comp}$). This can be performed in frequency synthesizers, where an integer multiple n of a stable lower frequency reference signal is generated as an output. Integer multiple n can be an integer value fixed in the circuitry, or in some cases can also be controlled by an external signal, such as a digital input. Multiplier n 120 may actually be a divide by n counter added between VCO 116 and phase detector 104. Phase detector 104 then converts the phase difference to a voltage and VCO 116 converts the voltage to the derivative of phase with respect to time (i.e., frequency). Thus, VCO 116 actually acts as an integrator in this example.

The parameters of LPF 108 can be set at design time, or can be controlled externally such as by a digital input. However, controlling the characteristics of LPF 108 has effects on both loop transients and jitter rejection. If LPF 108 is adjusted so that it filters very aggressively, it will be highly effective at filtering out jitter. But this will come at the cost of a broader, natural response in the control loop. This translates to larger swings above and below the target phase in the output signal.

The loop's natural response can be improved, resulting in much smaller swings above and below the target phase, by making LPF 108 much less aggressive. But, by reducing the aggressiveness of LPF 108, the jitter rejection of PLL 100 is significantly reduced, and PLL 100 is therefore more subject to external disturbances.

In a classic PLL, jitter rejection and loop transient response are inversely related. A nonaggressive loop filter keeps loop transients quiet, but allows more jitter in. A more aggressive filter better rejects jitter, but will be more sensitive to loop transients. This is known as the "loop bandwidth trade-off."

Figure 2:
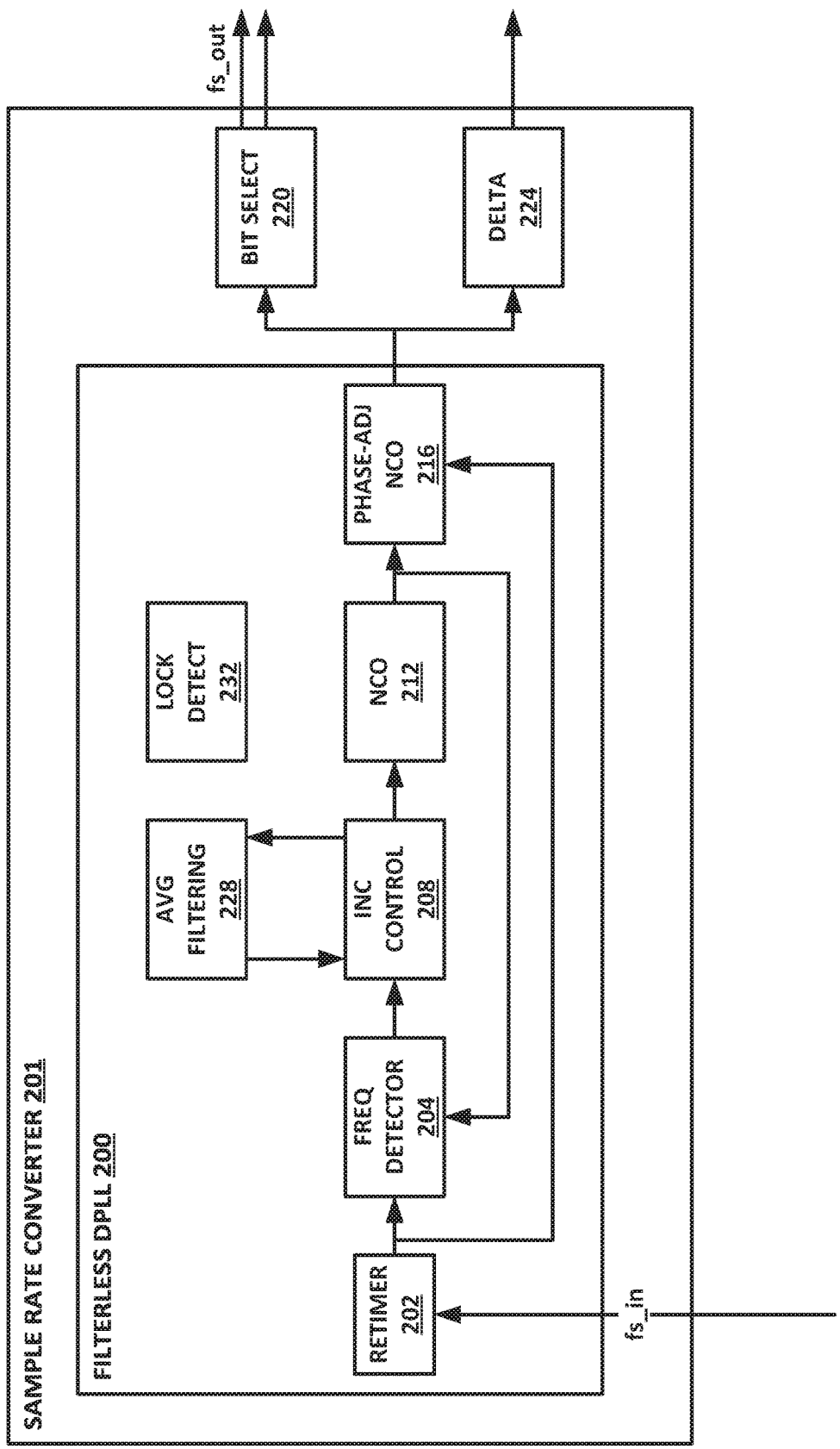
FIG. 2 is a block diagram of a filterless digital phase-locked loop (DPLL) illustrated in situ with selected elements of a sample rate converter, according to the teachings of the present specification.

FIG. 2 is a block diagram of a filterless digital phase-locked loop (DPLL) 200 illustrated in situ with selected elements of a sample rate converter 201, according to the teachings of the present specification. Note that the elements shown here are selected to illustrate operation of DPLL 200. Other elements of sample rate converter 201 may perform other functions, and the omission of those elements here should not be understood to imply that they must or should be omitted from an operational sample rate converter.

Sample rate converter 201 may be configured to receive an input digital signal and convert the frequency to a new output frequency. This requires an in-chip mechanism to accurately estimate the incoming sample rate, and the ability to accurately estimate the elapsed time since the last sample. Filterless DPLL 200 receives a sample frequency $fs_{in}$, and sample rate converter 201 converts that to an output frequency $f_{out}$, which is a different frequency from the input frequency $fs_{in}$. To accurately perform this conversion, it is desirable to first lock filterless DPLL 200 to $fs_{in}$. As discussed above, it is also desirable for filterless DPLL 200 to have a jitter rejection that correlates directly instead of inversely with quieting of loop transient response.

Initially, filterless DPLL 200 receives $fs_{in}$ as an input pulse. Specifically, filterless DPLL 200 may be configured to react on an edge such as a rising edge (or, alternatively, as a falling edge) of $fs_{in}$.

Retimer 202 retimes the input pulse to drive to filterless DPLL 200.

Frequency detector 204 is an integrator that reacts to an edge such as the rising edge of $fs_{in}$, as retimed by retimer 202. Frequency detector 204 reacts to the edge of an input clock pulse by outputting an impulse pulse at a configured magnitude. The magnitude of the impulse determines the quantity by which the output frequency is adjusted. For example, the larger the magnitude of the impulse, the larger the magnitude of the adjustment.

Increment controller 208 counts pulses from frequency detector 204, and responsive to the pulses, outputs a numerical (e.g., digital) output to number-controlled oscillator 212.

NCO 212 is an edge-sensitive digital counter that is analogous to a crystal in a standard PLL, and which outputs a frequency as controlled by its numeric input. The greater the magnitude of the impulse from frequency detector 204, the greater the output of increment controller 208, which in turn causes NCO 212 to adjust its output frequency accordingly.

NCO 212 internally determines whether to increment or decrement its clock frequency by the quantum amount based on the control signal from increment controller 208. If NCO 212 receives a new impulse before the next rising edge of its own clock output, then the clock output is too slow, and therefore, the clock speeds should be increased. On the other hand, if NCO 212 outputs two or more clock edges before receiving a new impulse signal from increment controller 208, then the clock output is too fast, and it is decremented by the quantum value.

Note that in this configuration, frequency detector 204 detects the input frequency directly in the frequency dimension, while NCO 212 adjusts the frequency directly in the frequency dimension by incrementing or decrementing its output clock by a quantum value based on the timing of input pulses. Thus, NCO 212 is able to generate an output clock at the same frequency as $fs_{in}$. Note that the output clock may be out of phase with $fs_{in}$, even though it may be synchronized to the correct frequency.

Because frequency detector 204 measures frequency directly in the frequency dimension, there is no loop bandwidth trade-off between jitter and loop transient response. Specifically, the frequency detector's use of impulses to control the loop causes an overdamped response. The loop bandwidth trade-off is eliminated by a combination of the dimension-matching (frequency measured directly) and the overdamped behavior.

Phase-adjusted NCO 216 receives the output clock from NCO 212 and the input clock from retimer 202, and can calculate a phase difference between the two directly in the phase dimension. Phase-adjusted NCO 216 may be an integrator, and may use ordinary integration techniques (e.g., a numerical counter) to integrate phase from frequency. The output of phase-adjusted NCO 216 is an output clock signal that is at the same frequency, and in phase with, $fs_{in}$.

Filterless DPLL 200 may also include averaging filter 228 and lock detect 232. Averaging filter 228 may be used to control the gain at which increment controller 208 operates. In a PLL, it is often desirable to operate very aggressively (e.g., at a high gain) to get relatively close to the desired lock value, and then, once the system is close to the desired lock value, to reduce the gain and operate more conservatively to lock in more precisely on the desired gain. Thus, averaging filter 228 may start out by providing an aggressive gain for increment controller 208, which causes increment controller 208 to drive relatively large values to NCO 212, while seeking an initial near lock on the desired frequency. Once averaging filter 228 determines that it has a near lock on the desired frequency (e.g., by determining that it has started sinusoidally bouncing around a value), it may signal increment controller 208 to reduce gain, and thus drive smaller values to NCO 212. This reduces jitter and improves loop transients, thus allowing NCO 212 to seek a better lock on the frequency of $fs_{in}$. Once NCO 212 has locked on $fs_{in}$, lock detect 232 can determine that the lock has occurred, and can then signal other circuit components to indicate that a lock has been achieved. Note that because filterless DPLL 200 provides dimensionally-matched measurements (e.g., measuring frequency in the frequency dimension and measuring phase in the phase dimension), it is overdamped instead of underdamped as is the case in a more traditional PLL. In the overdamped case, filterless DPLL 200 approaches its lock value asymptotically, and does not oscillate around the critical value, so long as the magnitude of the impulse is set at a suitable value.

The output of phase-adjusted NCO 216, and the output of filterless DPLL 200 (optionally with additional amplifier elements) is an output clock that matches in frequency and phase to $fs_{in}$.

Sample rate converter 201 can then use the output frequency of filterless DPLL 200 to drive various circuit elements. Sample rate converter 201 may provide both output signals that operate at the original clock frequency, and a bit select 220, which can sample the clock at various sub-intervals, and thus provide an $fs_{out}$ that may operate at various integer or fraction values of the input clock signal. This can be used to drive circuit elements that operate at frequencies other than the input clock frequency, such as elements that operate at a fraction of the clock frequency or a multiple of the clock frequency.

Delta 224 is a block that allows circuit elements to operate at fractions of the input frequency (as opposed to integer divisions or multiplications of it). Specifically, fractional interpolator 824 (FIG. 8) uses the delta value to do fractional rate conversion of the audio data.

Figure 3:
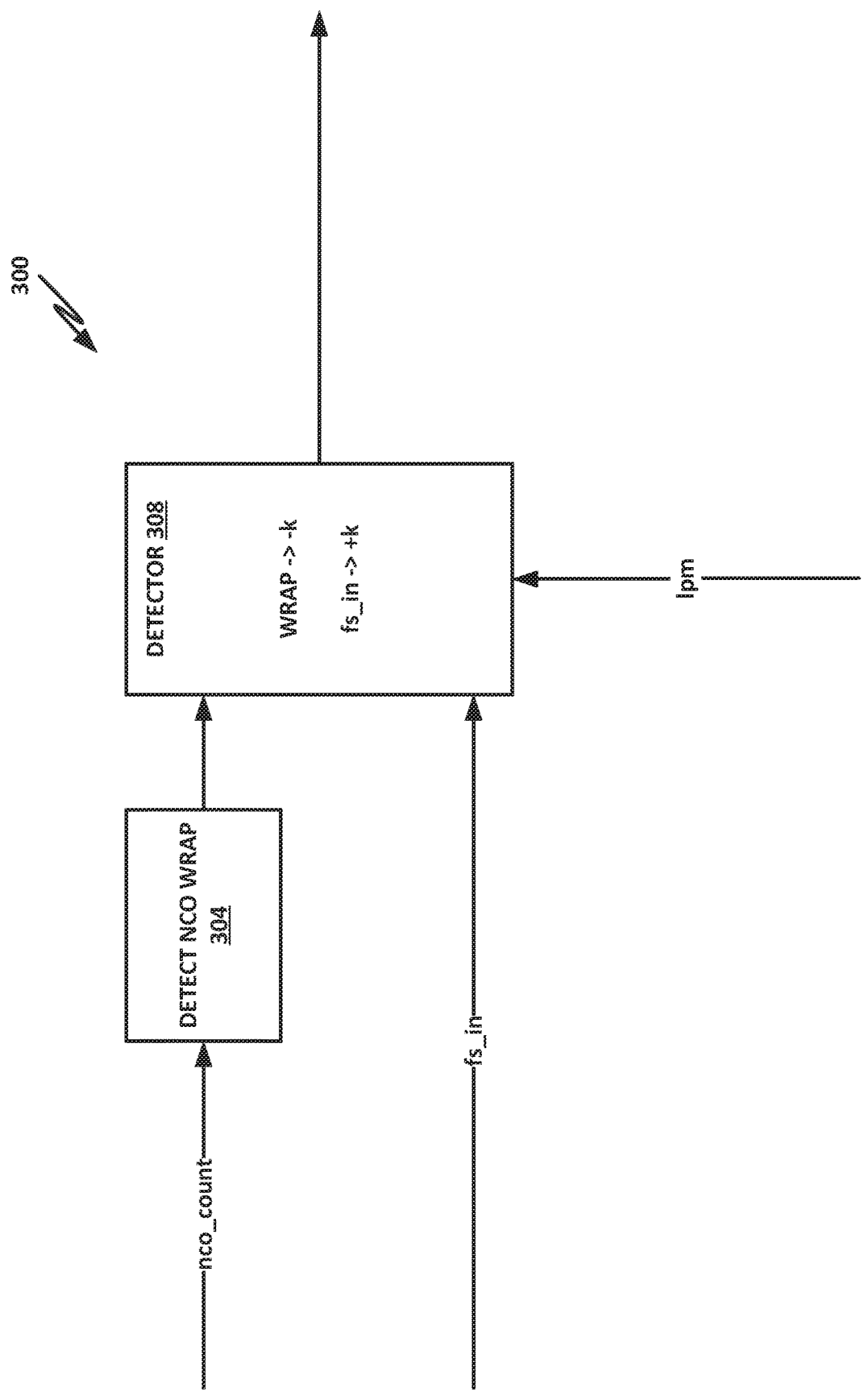
FIG. 3 is a block diagram of a frequency detector, according to the teachings of the present specification.

FIG. 3 is a block diagram of a frequency detector 300, according to the teachings of the present specification. Frequency detector 300 may be an embodiment of frequency detector 204 of FIG. 2, or may be a separate circuit. Frequency detector 300 receives $fs_{in}$ and NCO count as its inputs, and further provides low power mode LPM, which operates frequency detector 300 (or other circuit, by way of nonlimiting example) at a lower internal clock frequency. LPM is a control input to frequency detector 300 to change frequency detector 300's gain so the transient behavior of the DPLL remains unchanged despite a reduction in clock frequency.

Frequency $fs_{in}$ can represent the frequency sample input from the outside, while NCO count can represent a feedback of a frequency detector circuit.

Frequency detector 300 detects when NCO count wraps around, and also detects the sample rate of $fs_{in}$. Specifically, detect NCO wrap 304 detects when NCO count wraps around, thus representing a full clock cycle. Detect NCO wrap 304 outputs a pulse such as a clock edge when it detects a wrap on the NCO counter.

Detector 308 outputs either a positive or a negative value depending on whether NCO count wraps first, or whether a new pulse comes in.

If detector 308 receives the wrap pulse from detect NCO wrap 304 first, then it determines that the current clock frequency is too fast. Thus, in this case, it outputs a value of −k, meaning a pulse of magnitude k, indicating that the clock frequency should be slowed. This may be referred to as a "down" signal, indicating that the frequency should be reduced.

If, instead, detector 308 first receives $fs_{in}$, then it determines that the current frequency is too slow. In that case, it outputs a pulse of +k, indicating that the frequency should be driven "up," or increased.

The output k of detector 308, with a selectable magnitude and with a polarity of either plus or minus, can be used to control an increment or to attempt to make the NCO reach the exact frequency of $fs_{in}$. In this case, k is effectively the gain of the frequency detector. A higher k implies a faster lock. But with the higher k, the frequency will "bounce" around the target frequency with a wider swing. With a lower k, frequency detector 300 seeks the target frequency more slowly, but has better jitter reduction.

In some cases, frequency detector 300 may be configured to operate in two or more modes. In a first, "fast" mode, frequency detector 300 operates with high gain (i.e., a large value for k), and thus seeks the target frequency more aggressively. This comes at the cost of a larger swing above and below the target frequency. But this larger swing may be acceptable as this mode may represent an "initialization" stage, in which the circuit is not expected to operate at its stable mode, but rather is seeking its target frequency. Because the circuit may be configured to ensure that, in most cases, this initialization mode lasts for only a short, human-imperceptible period of time (such as tens of milliseconds), this initial noise in the signal may not be problematic. Once frequency detector 300 gets sufficiently near to the target frequency, it may dial back to a "slow" mode, in which it will approach the target frequency more gradually, but with much better transient response. This can be accomplished by significantly lowering the value of k, so that the system has better transient response and better jitter rejection. Once the system locks on the target frequency $fs_{in}$, it can operate with a very small value of k, providing excellent jitter rejection and transient response, with excursions above and below the target frequency that are only a tiny fraction of the target frequency, itself.

Note that frequency detector 300 is not a typical phase frequency detector (PFD). When a PFD is used in an existing PLL, once the frequency of the output has locked/stabilized, the PFD effectively operates as a phase detector that responds to minute changes in the phase of the input versus output to maintain the correct output frequency. In other words, the PFD operates as a function of phase. However, detector 308 does not detect frequency in the phase dimension by extracting from phase. Rather, detector 308 detects frequency directly in the frequency dimension. It responds only to the presence of the input frequency and NCO wrap events, both of which provide pulses at the frequency of their signals. Because detector 308 is sensitive only to these pulses, it operates directly as a function of frequency.

Figure 4:
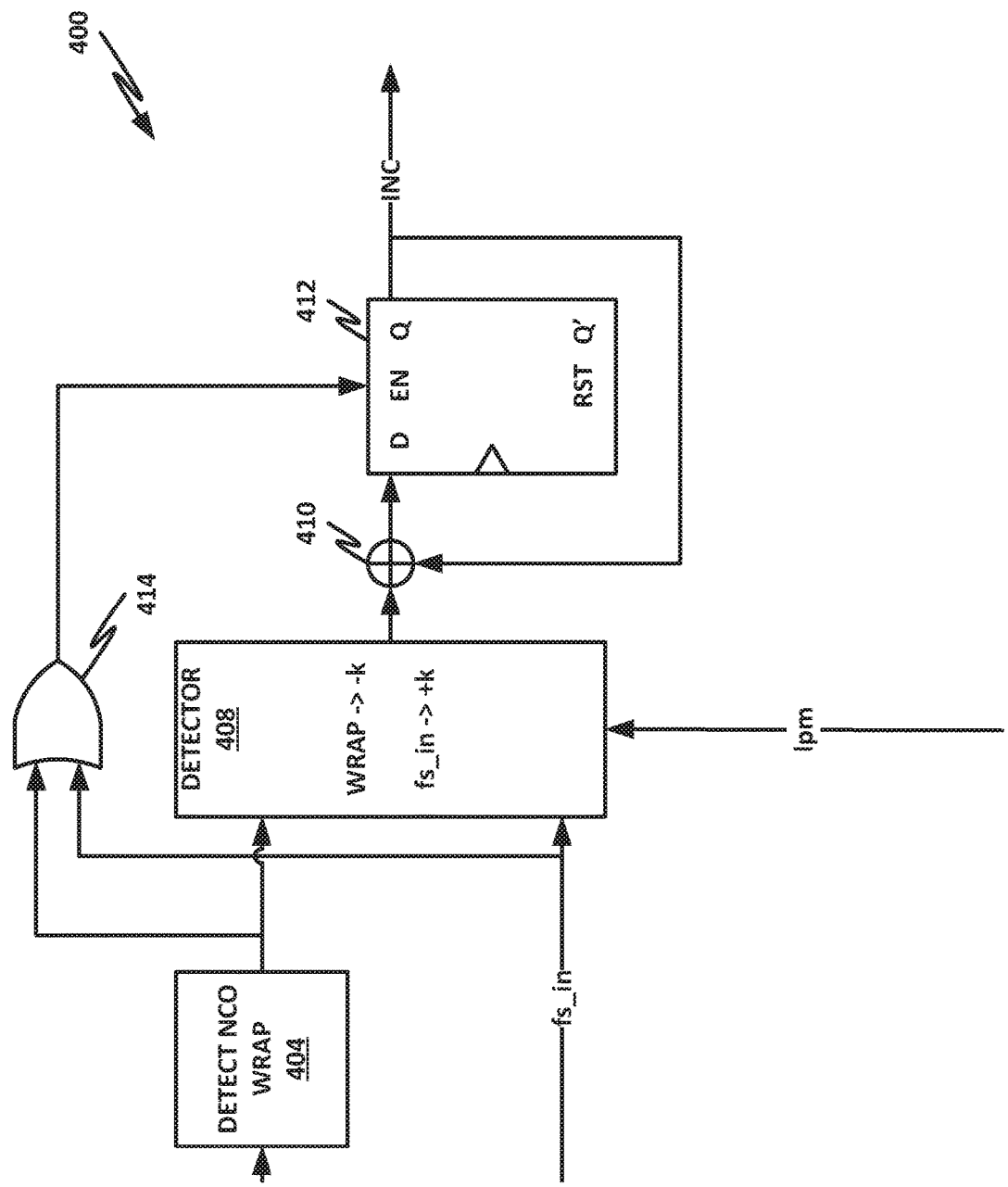
FIG. 4 is a block diagram illustrating a further embodiment of a frequency detector, according to the teachings of the present specification.

FIG. 4 is a block diagram illustrating a frequency detector 400, according to the teachings of the present specification. Frequency detector 400 may represent an embodiment that includes, for example, frequency detector 204 and increment controller 208 of FIG. 2. Frequency detector 400 includes detect NCO wrap 404 and detector 408, which may be substantially similar to detect NCO wrap 304 and detector 308 of FIG. 3. Adder 410, data ("D") flip-flop 412, and logical OR gate 414 together may provide additional elements to provide the function of increment controller 208.

In this configuration, D flip-flop 412 operates as an integrator. Specifically, adder 410 receives the k output of detector 408, and receives as an additional input the non-inverting ("Q") output of D flip-flop 412. Adder 410 sums these inputs and provides them to the D input of D flip-flop 412.

The enable input of D flip-flop 412 is coupled to OR gate 414. Thus, when the output of OR gate 414 is high, D flip-flop 412 is enabled. When the output of OR gate 414 is low, D flip-flop 412 is disabled.

OR gate 414 receives as its inputs the output pulse of detect NCO wrap 404, and the pulse of $fs_{in}$. Thus, when either of the signals pulses, the output of OR gate 414 is high. The detector feeds impulses based on edge/pulse events on $fs_{in}$, and the NCO wraps, rather than XORing the signals themselves like a typical phase detector would do. This produces an overdamped response. Flip-flop 412 is only enabled at these signal events.

As a result of this configuration, the integrator value is increased on an $fs_{in}$ pulse. The integrator value is decreased on an NCO wrap event. The output of frequency detector 400 is an increment signal.

Figure 5:
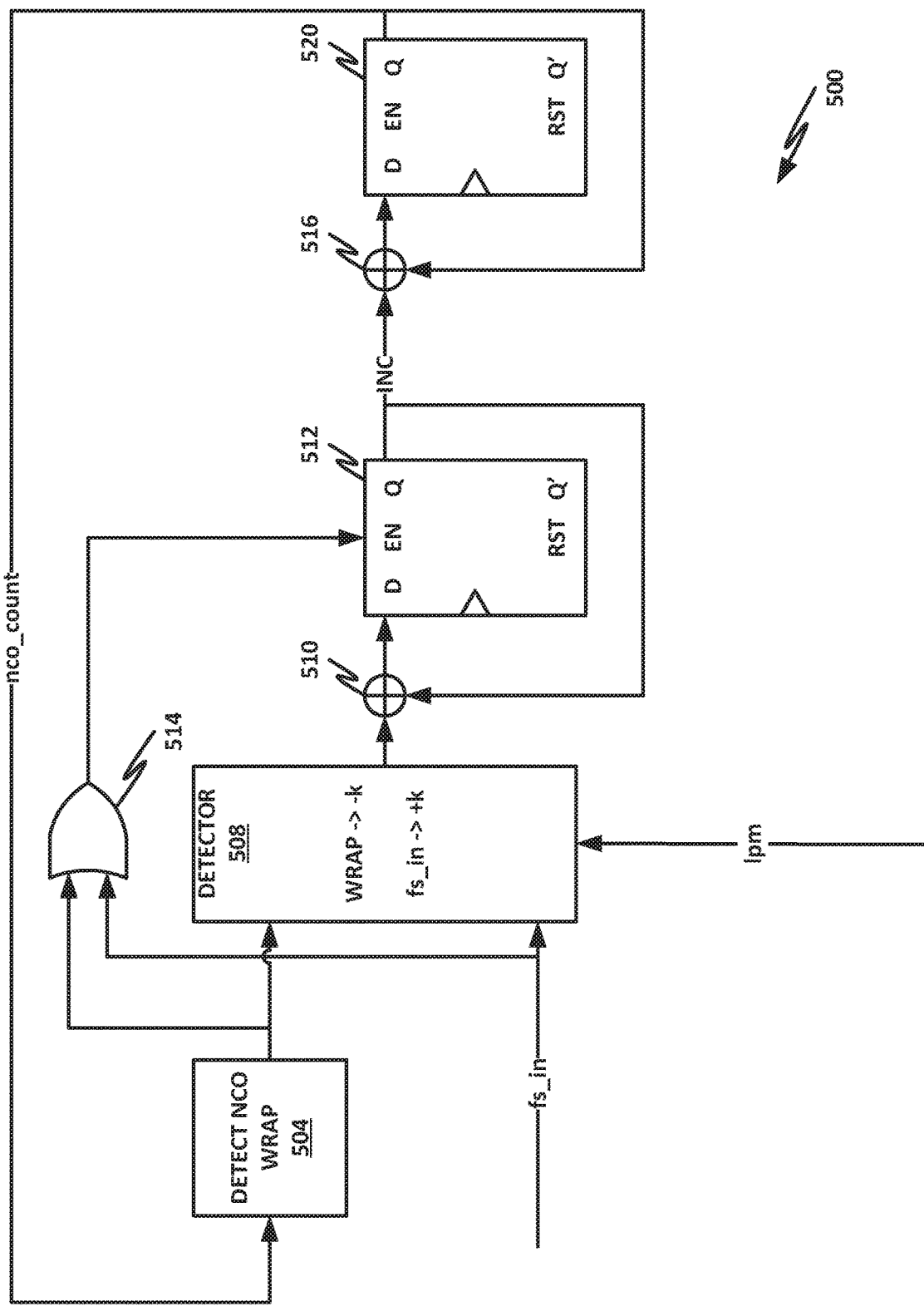
FIG. 5 is a block diagram illustrating selected elements of a DPLL, according to the teachings of the present specification.

FIG. 5 is a block diagram illustrating selected elements of a DPLL, according to the teachings of the present specification. Frequency detector 500 may be an example of frequency detector 204 in combination with increment controller 208 and NCO 212, or may be a different circuit. Frequency detector 500 includes detect NCO wrap 504, detector 508, adder 510, D flip-flop 512, and OR gate 514, which may be substantially similar to elements 404, 408, 410, 412, and 414 of FIG. 4, respectively. Newly added elements 516 and 520 provide functional equivalence of NCO 212.

Adder 516 and D flip-flop 520 provide yet another integrator, which provide as their output the NCO count signal, which is an input to detect NCO wrap 504.

Adder 516 receives as its inputs the increment pulse from D flip-flop 512, and a feedback of NCO count from the non-inverting ("Q") output of D flip-flop 520. The sum of these two signals is provided to the D input of D flip-flop 520. The output of D flip-flop 520 is the NCO count signal, which is used to drive detect NCO wrap 504.

This feedback configuration completes the frequency control loop.

As discussed above, the NCO count can operate in a fast or a slow mode. Locking from the slow direction, there are generally more "up" signals in the incrementor to speed up the NCO. When locking from the fast direction, there are more "down" signals in the incrementor to slow down the NCO. Eventually, NCO count and $fs_{in}$ reach a near 1:1 ratio (in other words, the NCO count pulse is occurring approximately as frequently as the $fs_{in}$ pulse). At this point, the location of $fs_{in}$ starts bouncing back and forth between two points along the NCO ramp. An instantaneous increase in observed $fs_{in}$ causes more "m+1" increments, which increases the NCO speed. In other words, m+1 represents an increase in slope. An instantaneous decrease in observed $fs_{in}$ causes more "m" increments, which decreases NCO speed. Stated otherwise, m has a smaller slope than m+1, representing a less aggressive k. The locking behavior can be demonstrated mathematically by:

$$N = mt_1 + (m+1)(T_1 - t_1) = mt_2 + (m+1)(T_2 - t_2)$$

-continued $$m(t_1 - t_2) = (m+1)(T_2 - t_2 - T_1 + t_1)$$

$$\frac{m}{m+1} = \frac{(T_2 - T_1) + (t_1 - t_2)}{t_1 - t_2}$$

$$m > 0 \therefore \frac{(T_2 - T_1) + (t_1 - t_2)}{t_1 - t_2} < 1$$

If $t_1 < t_2$, then $fs\_in$ is slower than NCO; we want $T_2 > T_1$:

$$t_1 - t_2 < 0 \therefore (T_2 - T_1) + (t_1 - t_2) > t_1 - t_2 (T_2 - T_1) > 0 \therefore T_2 > T_1$$

If $t_1 > t_2$, then $fs\_in$ is faster than NCO; we want $T_2 < T_1$:

$$t_1 - t_2 > 0 \therefore (T_2 - T_1) + (t_1 - t_2) < t_1 - t_2 (T_2 - T_1) < 0 \therefore T_2 < T_1$$

Figure 6:
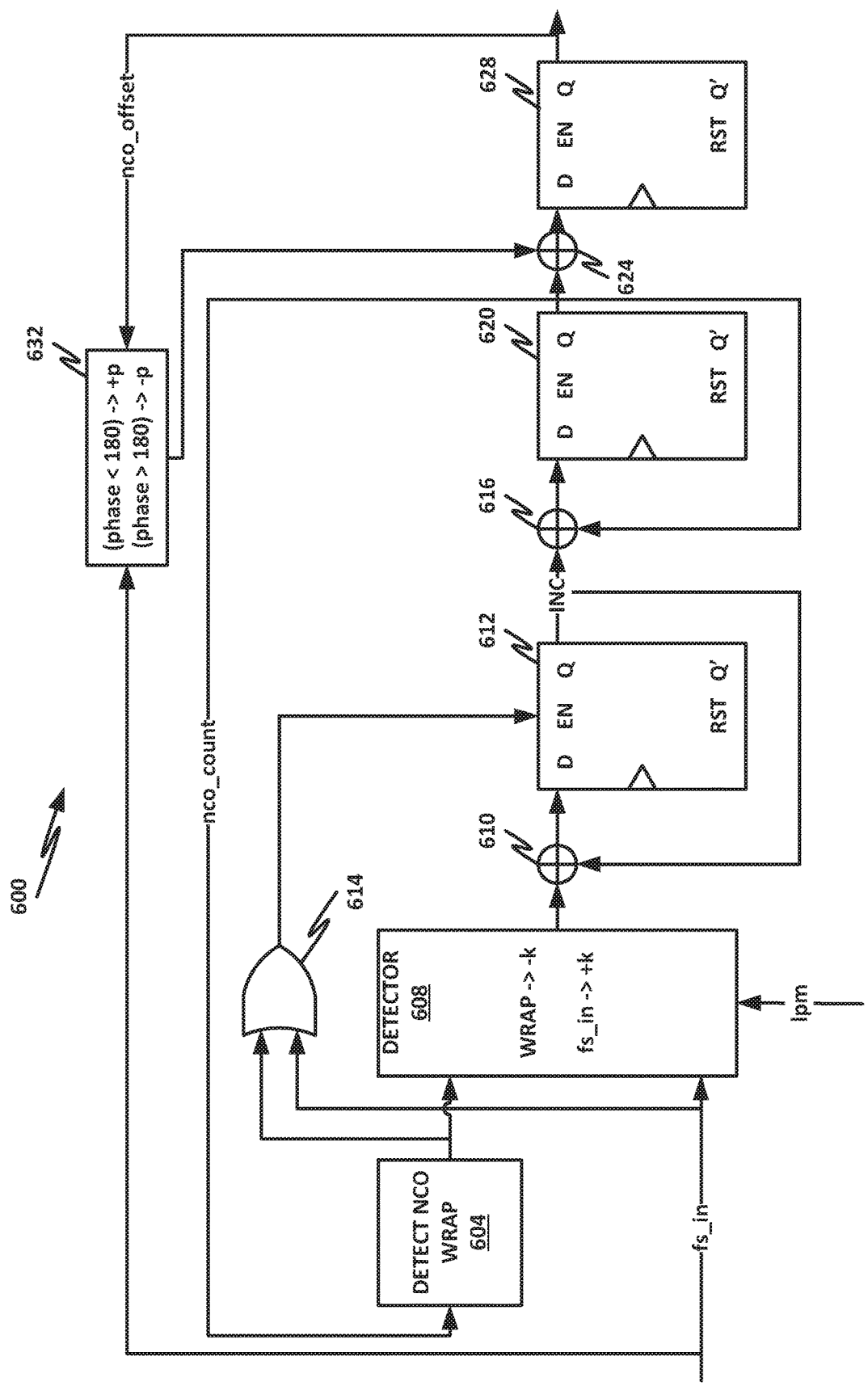
FIG. 6 is a block diagram illustrating a detailed view of a PLL, according to the teachings of the present specification.

FIG. 6 is a block diagram illustrating a detailed view of a PLL 600, according to the teachings of the present specification. PLL 600 may represent an embodiment that includes frequency detector 204, increment controller 208, NCO 212, and phase-adjusted NCO 216 of FIG. 2, or a different circuit. PLL 600 includes detect NCO wrap 604, detector 608, adder 610, D flip-flop 612, OR gate 614, adder 616, and D flip-flop 620, which may be substantially similar to elements 504, 508, 510, 512, 514, 516, and 520 of FIG. 5, respectively. Newly added to PLL 600 are adder 624, D flip-flop 628, and phase adjuster 632.

Adder 624, D flip-flop 628, and phase adjuster 632 may represent an embodiment of phase-adjusted NCO 216, or a different circuit. Adder 624 receives the NCO count output from D flip-flop 620, and also receives as an input a +p or −p (e.g., increased phase or decreased phase) signal from phase adjuster 632. The sum of these signals is provided to the D input of D flip-flop 628. The non-inverting ("Q") output of D flip-flop 628 is provided as an NCO offset pulse to phase adjuster 632. These elements provide phase detection and offset for phase consistency.

Because the NCO loop can lock to any phase relative to $fs_{in}$ (the phase represents the "fractional" portion of the ratio between $fs_{in}$ and the local clock mclk), a second phase-adjusted NCO is added with an offset. The phase between $fs_{in}$ and the second NCO is monitored and an incremental offset adjustment is made to keep a consistent phase degree between the difference of NCO count relative to $fs_{in}$. In this configuration, phase adjuster 632 is configured to maintain a consistent 180° phase difference between NCO offset and $fs_{in}$. This 180° phase difference aligns the signals directly out of phase. This can aid in digital signal processing, particularly with respect to easing the transfer of data. This should be understood as a nonlimiting example, however, and phase adjuster 632 could be configured to keep NCO offset and $fs_{in}$ at any desired phase relative to one another. For example, NCO offset could be kept directly in phase with $fs_{in}$, or at any other phase angle between 0° and 360°.

Figure 7:
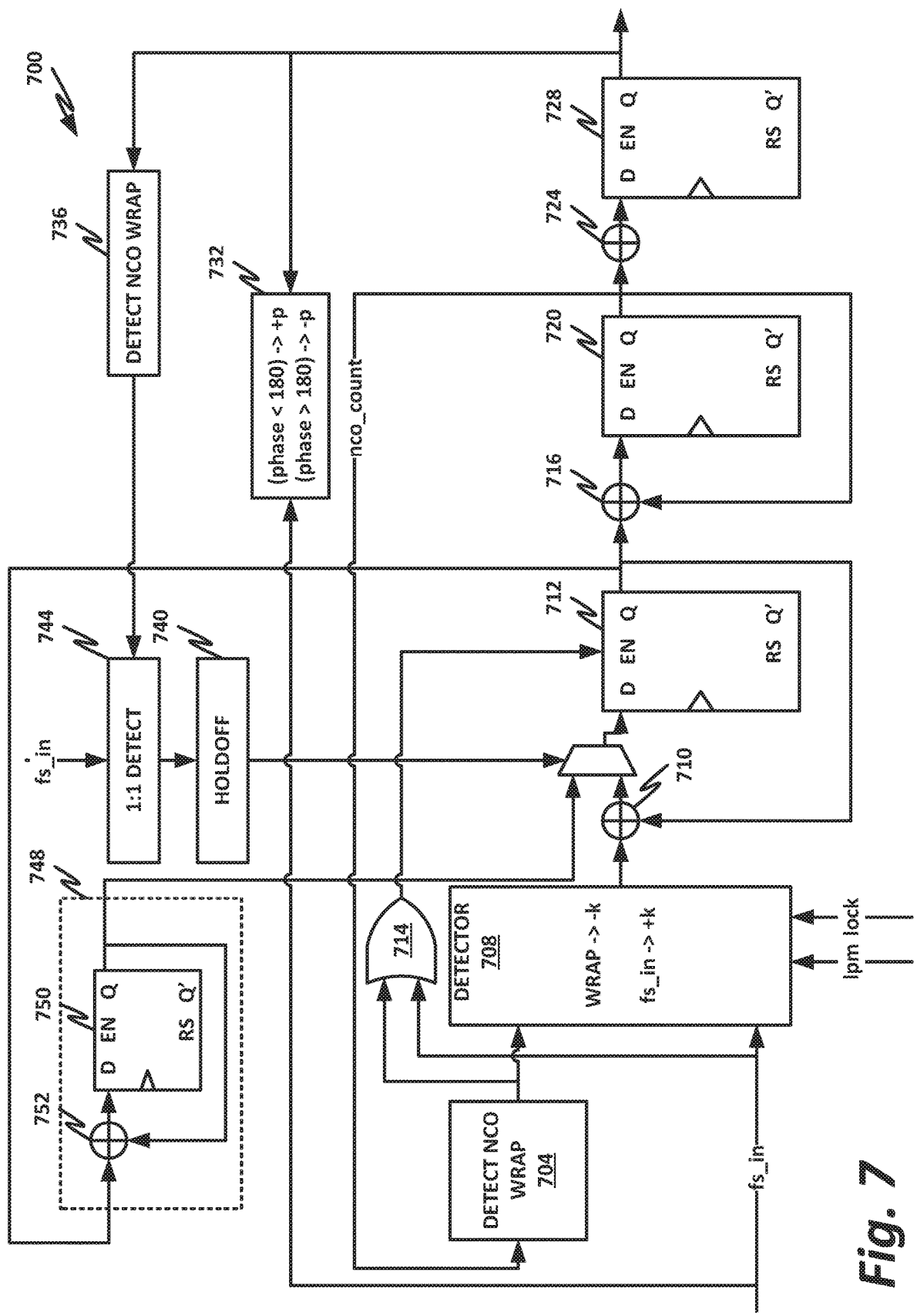
FIG. 7 is a block diagram illustrating a further embodiment of a PLL, according to the teachings of the present specification.

FIG. 7 is a block diagram illustrating a detailed view of a PLL 700, according to the teachings of the present specification. PLL 700 may represent elements of frequency detector 204, increment controller 208, NCO 212, phase-adjusted NCO 216, averaging filter 228, and lock detector 232 of FIG. 2, or a different circuit.

PLL 700 includes detect NCO wrap 704, detector 708, adder 710, D flip-flop 712, OR gate 714, adder 716, D flip-flop 720, adder 724, D flip-flop 728, and phase adjuster 732, which may be substantially similar to elements 604, 608, 610, 612, 614, 616, 620, 624, 628, and 632 of FIG. 6.

PLL 700 further adds detect NCO wrap 736, 1:1 detector 744, holdoff 740, and averaging block 748, which includes adder 752 and D flip-flop 750.

When the NCO wrap remains within one $fs_{in}$ window for enough samples, the loop is considered locked. Thus, detect NCO wrap 736 detects when the NCO wraps around. This may be a function similar or identical to 704, and in some cases, detect NCO wrap 736 may simply be provided by an additional output from detect NCO wrap 704. 1:1 detector 744 also receives $fs_{in}$, and detects when the NCO wrap and the $fs_{in}$ match at a 1:1 ratio for a sufficient number of cycles.

Averaging circuit 748 is an integrate and dump lock detector which detects an integrate and dump average over a number of cycles (see averaging filter 228 of filterless DPLL 200 of FIG. 2). When NCO wrap and $fs_{in}$ have a 1:1 ratio for a sufficient number of cycles as determined by averaging circuit 748, the loop is considered locked. At that point, the frequency detector gain (k) can be decreased. But an instantaneous and abrupt decrease in k may drive substantial transients. Thus, averaging circuit 748 may provide an averaged output across a number of cycles.

Holdoff block 740 provides a select signal to select between the average of block 748 or the k value of detector 708.

In operation, when detector 708 detects that it has locked in, it immediately reduces k, potentially to a substantially smaller value. To avoid excessive noise in the circuit, however, holdoff 740 provides a holdoff input, so that the average output from averaging circuit 748 is selected as the input to D flip-flop 712, instead of the new k value. After a number of averaged cycles (such as $2^{14}$ average cycles), the system has stabilized to the new k value, and the holdoff signal can then be brought low to allow selection of the k output from detector 708.

Figure 8:
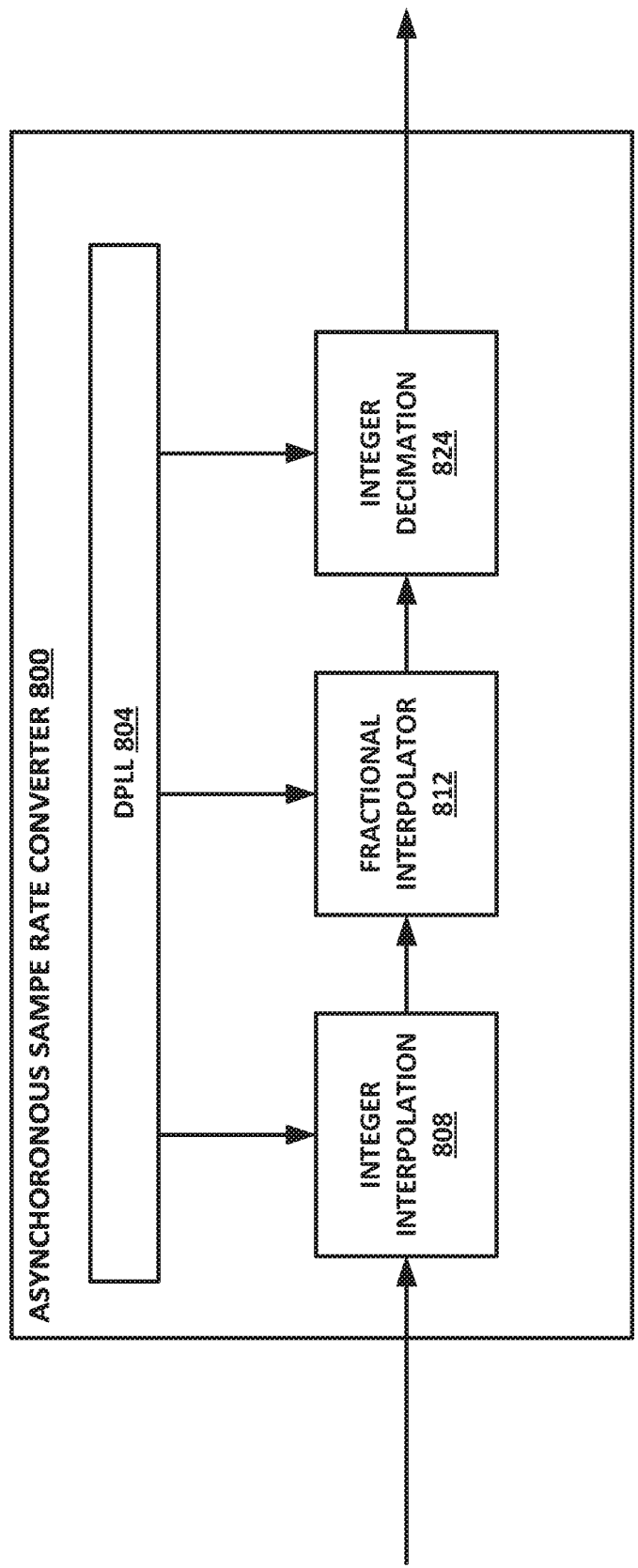
FIG. 8 is a block diagram of selected elements of an asynchronous sample rate converter (ASRC), according to the teachings of the present specification.

FIG. 8 is a block diagram of selected elements of an asynchronous sample rate converter (ASRC), according to the teachings of the present specification. ASRC 800 includes a DPLL 804, which may include any of the PLLs or DPLLs illustrated in the present specification. For example, DPLL 804 may include one or more elements of filterless DPLL 200 of FIG. 2.

As illustrated in sample rate converter 201 of FIG. 2, filterless DPLL 200 may include a bit select block 220, which provides a divided sample rate output. For example, bit select 220 may provide output bits at ½, ¼, ⅛, or some other fraction or multiple of the clock rate provided by DPLL 804. These oversampled or undersampled rates may be provided to various elements of ASRC 800, such as a sample rate converter according to the teachings of the present specification. ASRC 800 includes a DPLL 804, which may be provided, for example, by filterless DPLL 200 of FIG. 2, or by another circuit. As illustrated in filterless DPLL 200, a bit select block 220 may be provided to drive a fractional or multiple output of the phase-adjusted NCO clock. For example, bit select 220 may drive out frequencies at ½, ¼, ⅛, ⅓, or any other fraction of the clock, or a multiple of the clock. As illustrated in ASRC 800 of FIG. 8, DPLL 804 may provide appropriate clock signals to the various elements within ASRC 800. These elements include voice Because ASRC 800 changes the sample rate of the input audio data, filtering eliminates imaging and aliasing artifacts. This can be provided by a plurality of stages, for example, integer interpolation 808, fractional interpolation 812, and integer decimation 824, though other blocks may also be used for other purposes.

Filterless DPLL 804 drives an appropriate clock (e.g., the full clock, or a fractional clock) to each of integer interpolation 808, fractional interpolation 812, and integer decimation 824. The bit select outputs from the DPLL may drive the different stages, as appropriate, and the delta output (224, FIG. 2) controls the fraction in fractional interpolation stage 812.

Figure 9:
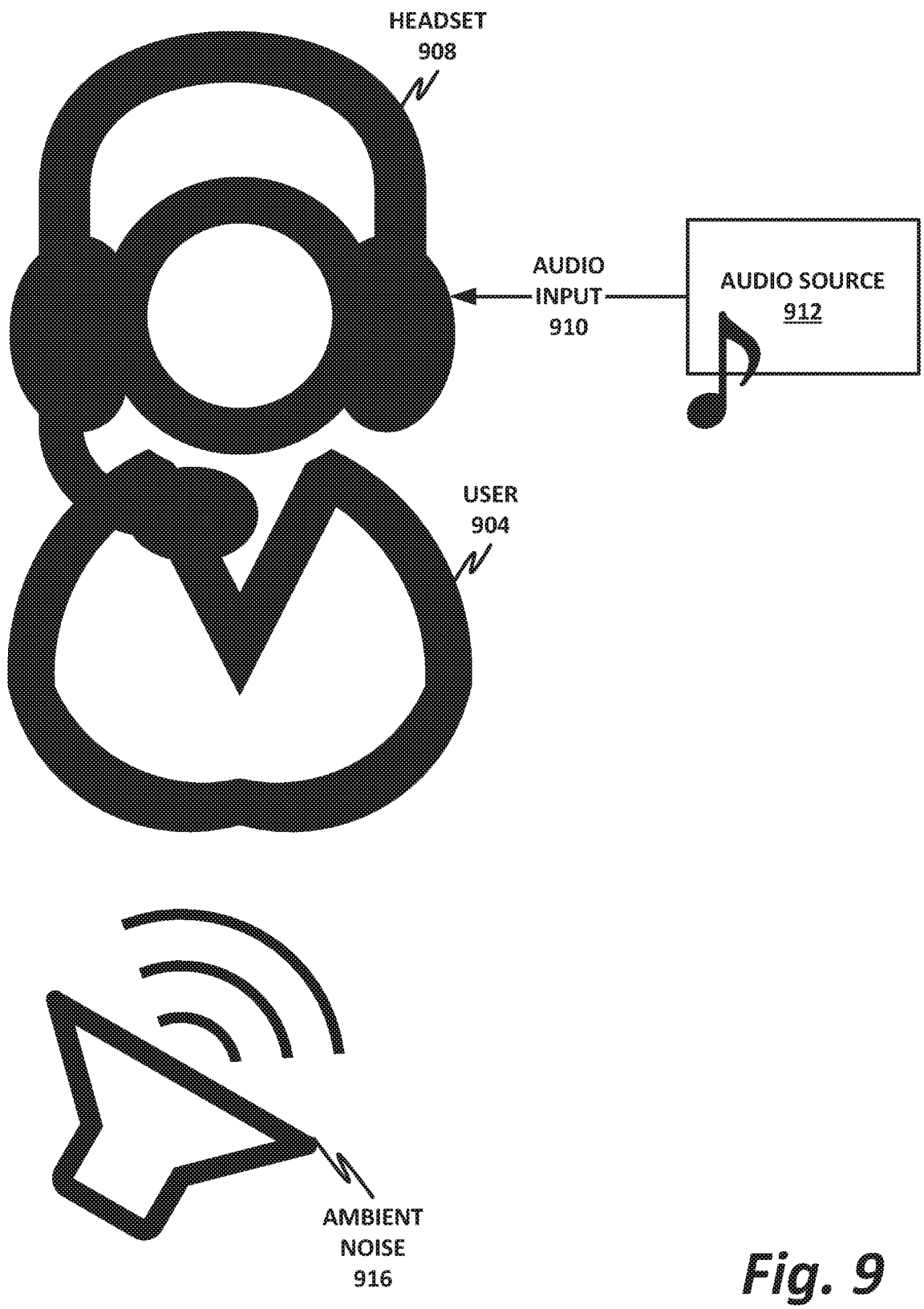
FIG. 9 is an illustration of a user operating a headset, according to the teachings of the present specification.

FIG. 9 is an illustration of a user operating a headset, according to the teachings of the present specification. The disclosed embodiment illustrates a potential use case of an audio subsystem, which can include by way of nonlimiting example some or all of the elements illustrated in FIG. 9, including one or more of the DPLLs illustrated herein. In this illustration, user 904 operates a headset 908. Headset 908 connects to an audio source 912, which can provide an audio input 910.

Audio source 912 may be, by way of illustrative and nonlimiting example, home entertainment center speakers, portable speakers, concert speakers, a cell phone, a smart phone, a portable MP3 player, any other portable music player, a tablet, a laptop, or a portable video device. Audio source 912 could also be a non-entertainment device, such as a device used in the medical arts, a device used for communication, a device used in a manufacturing context, a pilot headset, an amateur radio, any other kind of radio, a studio monitor, a music or video production apparatus, a Dictaphone, or any other device to facilitate the electronic conveyance of audio signals.

Audio input 910 may be either an analog audio input provided, e.g., via a standard 3.5 mm audio jack (or other audio jack), a 7 mm jack, or a two-prong airplane headphone jack, by way of nonlimiting example. Audio input 910 could also be a digital audio, such as digital data provided via universal serial bus (USB), Bluetooth, Ethernet, or other digital wired or wireless communication medium.

Audio input 910 is provided to headset 908, and user 904 listens to or monitors audio via headset 908. Headset 908 may be, by way of illustrative and nonlimiting example, earbuds, headphones, a hands-free device, a headset with voice and audio capability, a Bluetooth headset, some other wireless headset, or other audio listening device. Note that while headset 908 is provided as an illustration, any suitable audio driver could be used herein, including speakers or other waveform drivers. Furthermore, although audio is illustrated herein as an example of a signal processing application that benefits from the teachings of the present specification, it should be understood that other applications are also available. For example, standard radio detection and ranging (radar), light detection and ranging (lidar), ground penetrating radar, surveying, mineral exploration, signal conditioning, signal generation, and many other applications include the generation, processing, and sampling of periodic waveforms. Any of those applications could benefit from the teachings herein.

In some cases, user 904 may be in an environment where he experiences ambient noise 916. Ambient noise 916 may interfere to some degree with user 908's use and/or enjoyment of headset 906. To provide just one illustrative and nonlimiting example, user 904 may be listening to music or watching a video on an aircraft. There are many ambient sounds on an aircraft that may disturb the user's enjoyment of the audio or video, including the engine sounds, noise from other passengers or crew speaking, and other ambient aircraft sounds. To enhance the utility of headset 908, and in some cases to increase the user's enjoyment of the audio input 910, headset 908 may provide noise cancellation. Noise cancellation is a method in which ambient noise is filtered out to some degree from audio input 910. This can include both passive and active noise cancellation. Passive noise cancellation may be provided, for example, by the structure of headset 908, which can include structural components such as padding, covers, and other elements that passively block ambient noise.

Active noise cancellation (also known as active noise reduction) can be provided electronically by sampling ambient noise 916, and generating a waveform that matches ambient noise 916 as closely as possible, and that is directly out of phase with ambient noise 916. By mixing this noise cancellation signal in with audio input 910, headset 908 experiences destructive interference with ambient noise 916. This has the beneficial effect of allowing user 904 to better hear audio input 910 without disturbance from ambient noise 916.

Figure 10:
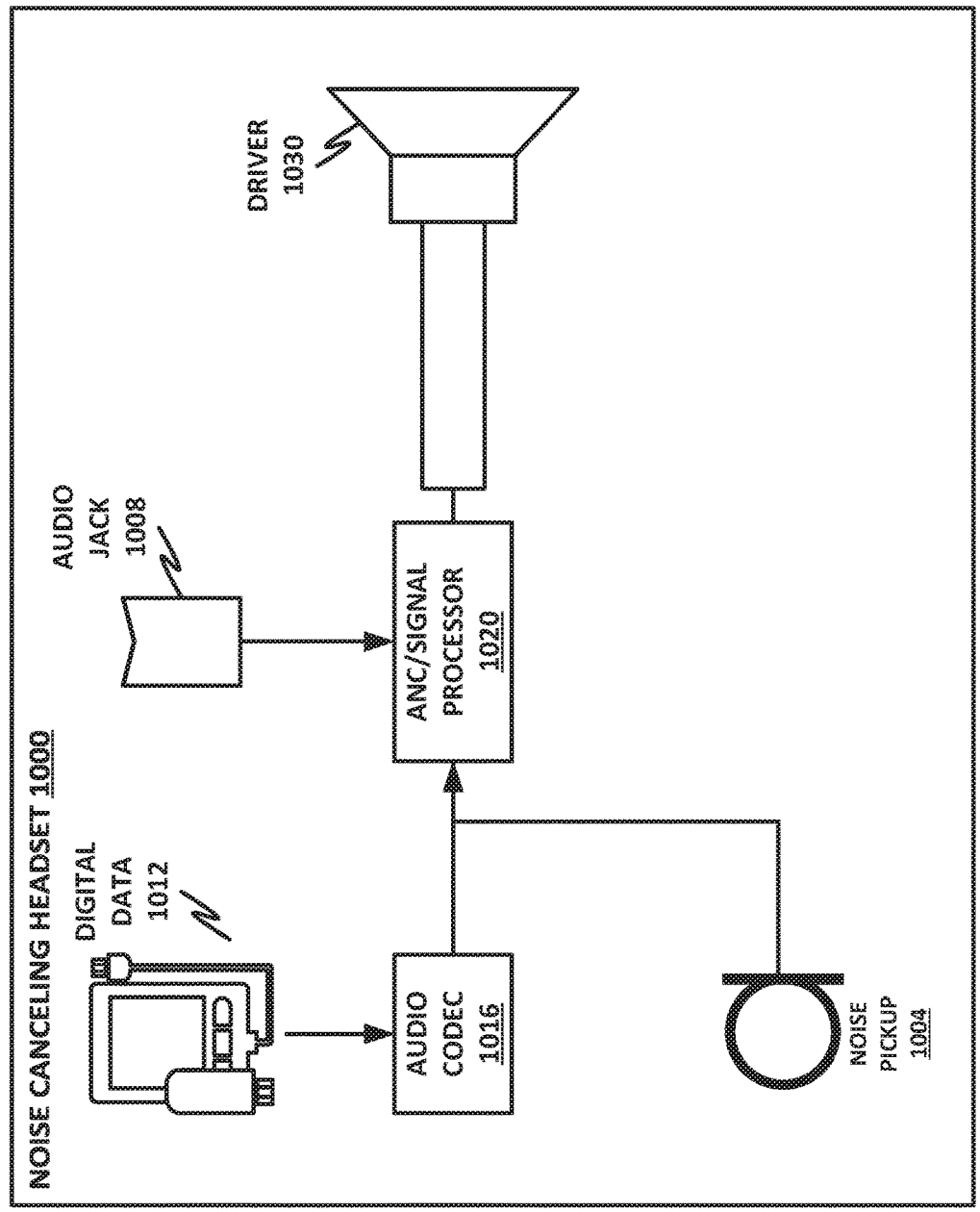
FIG. 10 is a block diagram of a noise canceling headset, according to the teachings of the present specification.

FIG. 10 is a block diagram of a noise canceling headset, according to the teachings of the present specification. Noise canceling headset 1000 may be an example or an embodiment of headset 908 of FIG. 9, or any other suitable circuit or structure.

Noise canceling headset 1000 includes a driver 1030, which drives the actual audio waveform out to the user for listening. Note that driver 1030 is illustrated here as a driver of a noise canceling headset 1000, but could be any suitable sinusoidal waveform driver. This could be an audio driver, a mechanical driver, or an electrical signal driver. Similarly, although noise canceling headset 1000 is provided as an illustrative application of the teachings of the present specification, it should be understood as a nonlimiting example. As in FIG. 1, other applications may include, by way of illustrative example, home entertainment center speakers, portable speakers, concert speakers, a cell phone, a smart phone, a portable MP3 player, any other portable music player, a tablet, a laptop, or a portable video device. Non-entertainment applications may include a device used in the medical arts, a device used for communication, a device used in a manufacturing context, a pilot headset, an amateur radio, any other kind of radio, a studio monitor, a music or video production apparatus, a Dictaphone, or any other device to facilitate the electronic conveyance of audio signals.

In the remainder of the description for FIG. 10, it is assumed that the teachings herein are embodied in a noise canceling headset 1000. In that case, driver 1030 may be a small headset driver.

As illustrated in previous FIGURES, noise canceling headset 1000 may be subject to ambient noise, which may interrupt or decrease the utility or enjoyment of noise canceling headset 1000. Thus, noise canceling headset 1000 includes a noise pickup 1004, which receives ambient noise from the environment so that it can be canceled. Noise pickup 1004 may provide the ambient noise to active noise cancellation (ANC)/signal processor 1020. Signal processor 1020 may be a mixed-signal circuit, which receives, for example, digital and analog audio inputs, encodes and/or decodes, provides active noise cancellation, provides other signal conditioning (including, for example, audio enhancements), and drives the resulting audio signal out to driver 1030 as an analog waveform.

Noise canceling headset 1000 includes an audio jack 1008, which is used to receive direct analog audio input. In cases where analog audio input is received, the analog data are provided directly to ANC/signal processor 1020, and signal processing is performed on the audio. Note that this may include converting the signal to a digital format, as well as encoding, decoding, or otherwise processing the signal. Note that in some cases, signal processing is performed in the analog domain rather than in the digital domain.

In some cases, noise canceling headset 1000 also includes a digital data interface 1012. Digital data interface 1012 may be, for example, a USB, Ethernet, Bluetooth, or other wired or wireless digital data interface. When digital audio data are received in noise canceling headset 1000, the data cannot be processed directly in the analog domain. Thus, in that case, data may be provided to an audio codec 1016, which can provide encoding and decoding of audio signals, and in some cases converts digital domain audio data to analog domain audio data that can be processed in the analog domain in ANC signal processor 1020.

Figure 11:
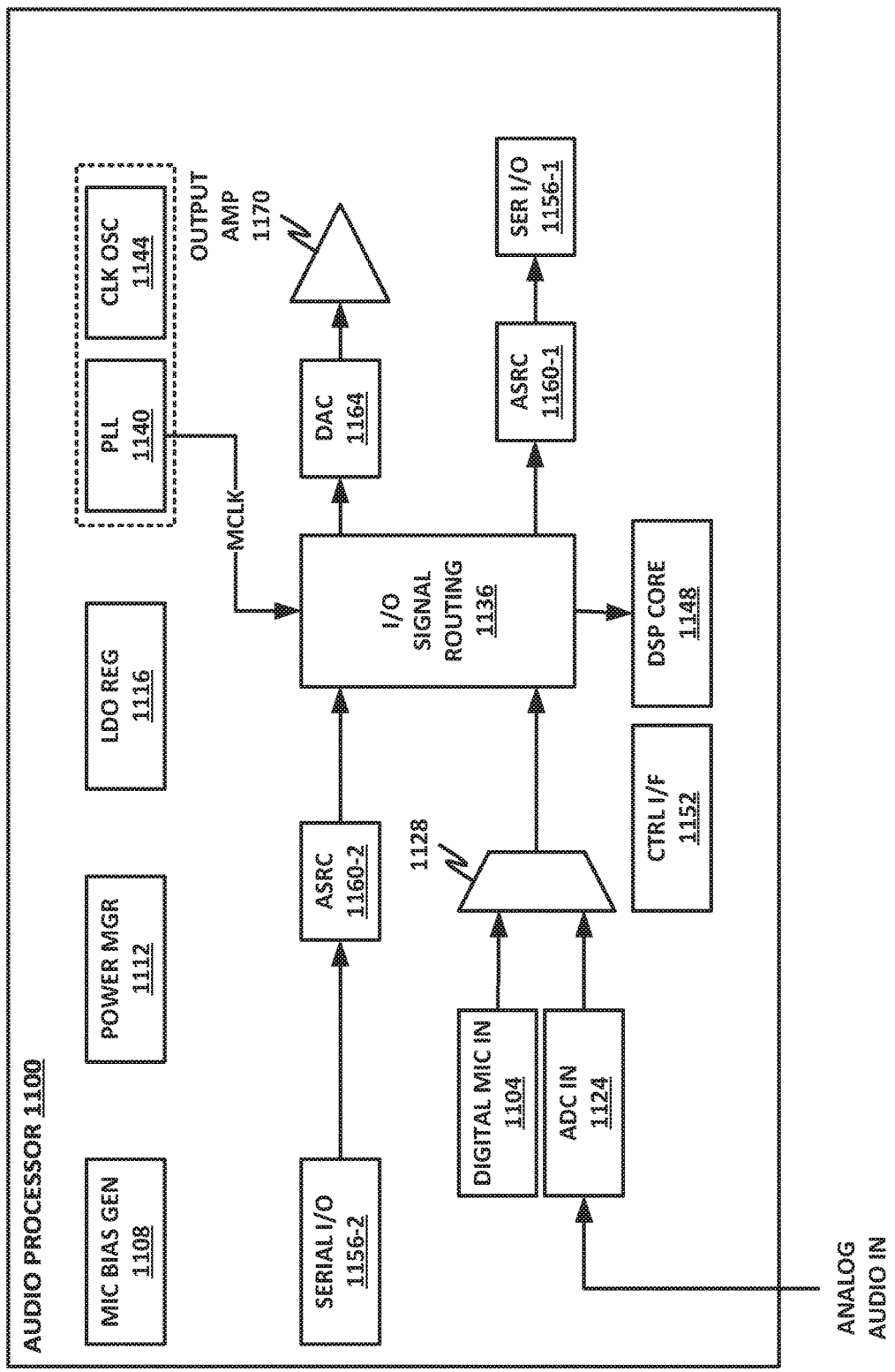
FIG. 11 is a block diagram of selected elements of an audio processor, according to the teachings of the present specification.

FIG. 11 is a block diagram of selected elements of an audio processor, according to the teachings of the present specification. Audio processor 1100 is an example of a circuit or an application that can derive benefits from the teachings of this specification, including the filterless DPLL described herein.

Only selected elements of audio processor 1100 are shown here. This is for simplicity of the drawing, and to illustrate applications for certain components. The use of certain components in this FIG. 1s not intended to imply that those components are necessary, and the omission of certain components is not intended to imply that those components must be omitted. Furthermore, the blocks shown herein are generally functional in nature, and may not represent discrete or well-defined circuits in every case. In many electronic systems, various components and systems provide feedback and signals to one another, so that it is not always possible to determine exactly where one system or subsystem ends and another one begins.

By way of illustrative example, audio processor 1100 includes a microphone bias generator 1108, that generates a DC bias for microphone input. This is for an embodiment that has both a microphone and a speaker, such as a headset, and microphone bias generator 1108 helps to ensure that the microphone operates at the correct voltage.

A power manager 1112 provides power conditioning, a steady voltage supply such as a DC output voltage, and power distribution to other system components.

Low dropout (LDO) voltage regulator 1116 is a voltage regulator that helps to ensure proper voltage is provided to other system components.

A PLL 1140 and clock oscillator 1144 together may provide mclk, the local clock signal for operation within the circuit. Note that while PLL 1140 can be a filterless DPLL as described in this specification, it may also be a simple analog PLL of a more traditional design.

Multiplexer 1128 multiplexes inputs from, for example, a digital microphone input 1104 and an analog to digital converter (ADC) input 1124. This provides the ability to receive either analog or audio input.

Serial I/O block 1156 is divided into two distinct blocks, namely 1156-1 and 1156-2. Series I/O block 1156 sends and receives serialized digital data, and may have different input and output clocks. Serial I/O block 1156 is illustrated here as two discrete blocks to illustrate that it receives inputs and drives outputs, but the two functions may in fact be located in a single discrete block with both input and output pins, or in some other configuration. Similarly, a bidirectional ASRC 1160 is divided into two logical blocks, ASRC 1160-1 and 1160-2. As with serial I/O block 1156, these may in fact be located on a single discrete block. The two logical blocks are illustrated separately here to illustrate the bidirectional nature of ASRC 1160. Because there may be phase and/or frequency mismatches in the clocks in either direction, ASRC 1160-1 can drive a clock to serial I/O block 1156-1, thus matching the clock of a receiver. ASRC 1160-2 can drive a clock to serial I/O block 1156-2, thus matching the clock of a sender.

Bidirectional ASRC 1160 includes both an input ASRC and an output ASRC, and may include distinct embodiments of an ASRC, such as sample rate converter (SRC) 201 of FIG. 2 and/or ASRC 800 of FIG. 8, by way of illustrative and nonlimiting example. ASRC 1160 may in some examples include one or more filterless DPLLs such as filterless DPLL 200 of FIG. 2, by way of illustration.

Bidirectional ASRC 1160 is asynchronous because it can convert the sampling rate of a signal that is asynchronous to the system in which the converter lies. In other words, the source data to the ASRC (or the source '$fs_{in}$' to the DPLL) can come from an external system that is not coupled to the ASRC's system by way of the same clock. So the two systems do not have to be explicitly synchronized from a timing perspective in any way. The relationship between the sampling frequencies being converted can span a wide range of fractions and need not be locked to any specific fraction or multiple. The ASRC can do this is because the DPLL is continuously monitoring the relationship between the two sample rates and adjusting itself accordingly.

I/O signal routing 1136 provides routing of signals between various components of audio processor 1100. I/O signal routing 1136 provides a digital audio output signal to digital-to-analog converter (DAC) 1164, which converts the digital audio to analog audio, then drives the analog audio to output amplifier 1170, which drives the audio waveform onto a driver.

A DSP core 1148 receives input/output signals, and provides audio processing. DSP core 1148 may include biquad filters, limiters, volume controls, and audio mixing, by way of illustrative and nonlimiting example. The audio processing can include encoding, decoding, active noise cancellation, audio enhancement, and other audio processing techniques. A control interface 1152 is provided for control of internal functions, which in some cases are user selectable. Control interface 1152 may also provide a self-boot function.

Note that the activities discussed above with reference to the FIGURES are applicable to any integrated circuit that involves audio signal processing, and may be more combined with circuits that perform other species of signal processing (for example, gesture signal processing, video signal processing, audio signal processing, analog-to-digital conversion, digital-to-analog conversion), particularly those that can execute specialized software programs or algorithms, some of which may be associated with processing digitized real-time data. Certain embodiments can relate to multi-DSP, multi-ASIC, or multi-SoC signal processing, floating point processing, signal/control processing, fixed-function processing, microcontroller applications, etc. In certain contexts, the features discussed herein can be applicable to audio headsets, noise canceling headphones, earbuds, studio monitors, computer audio systems, home theater audio, concert speakers, and other audio systems and subsystems. The teachings herein may also be combined with other systems or subsystems, such as medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for audio or video equipment, medical imaging, patient monitoring, medical instrumentation, and home healthcare. This could include, for example, pulmonary monitors, accelerometers, heart rate monitors, or pacemakers, along with peripherals therefor. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion, rendering, and display products in battery monitoring, control systems, reporting controls, maintenance activities, and others. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

EXAMPLE IMPLEMENTATIONS

The following examples are provided by way of illustration.

Example 1 includes a digital phase-locked loop (DPLL) circuit adapted to avoid loop-bandwidth tradeoff, the circuit comprising: a frequency dimension frequency detector having an external frequency input and a feedback frequency input, the frequency dimension frequency detector comprising circuitry to measure a frequency difference between the external frequency input and the feedback frequency input and to drive an impulse signal, wherein the impulse signal is of a first species if the difference is positive and of a second species if the difference is negative; and a number-controlled oscillator (NCO) comprising circuitry to drive an output clock and to adjust the frequency of the output clock responsive to the impulse signal, wherein an output of the NCO provides the feedback frequency input of the frequency dimension frequency detector.

Example 2 includes the DPLL circuit of example 1, wherein the frequency dimension frequency detector comprises a wrap detector to determine that an NCO counter has wrapped around.

Example 3 includes the DPLL circuit of example 1, wherein the first species is positive and the second species is negative.

Example 4 includes the DPLL circuit of example 1, wherein the circuitry to measure difference comprises an integrator to provide an increment controller.

Example 5 includes the DPLL circuit of example 1, further comprising a phase adjust NCO circuit to adjust the phase of the output clock relative to the external frequency input.

Example 6 includes the DPLL circuit of example 5, wherein the phase adjust NCO is configured to adjust the output clock to 180 degrees relative to the external frequency input.

Example 7 includes the DPLL circuit of example 1, wherein the frequency dimension frequency detector is configured to provide a configurable gain k.

Example 8 includes the DPLL circuit of example 7, wherein the frequency dimension frequency detector operates with gain $k_0$ in an initialization mode, and further comprising a 1:1 detect circuit to determine that the frequency of the output clock matches the frequency of the external input for n cycles and to reduce the gain to $k_1$.

Example 9 includes the DPLL circuit of example 8, further comprising an averaging filter disposed to gradually adjust between $k_0$ and $k_1$.

Example 10 includes the DPLL circuit of example 7, further comprising a lock detect circuit to determine that the output clock is locked to the external input.

Example 11 includes the DPLL circuit of example 7, further comprising a control input to adjust k.

Example 12 includes the DPLL circuit of example 1, further comprising a bit select circuit to provide a multiple or fraction of the output clock.

Example 13 includes the DPLL circuit of example 1, further comprising a retimer to sample the external input at a local clock frequency.

Example 14 includes an intellectual property (IP) block comprising the DPLL circuit of any of examples 1-13.

Example 15 includes an integrated circuit comprising the DPLL of any of examples 1-14.

Example 16 includes a sample rate converter (SRC) to re-clock an external signal to a local clock, comprising: an input port configured to receive input data from a first clock having a first clock rate; signal conditioning circuitry configured to operate from a second clock having a second clock rate; and a phase lock loop (PLL), comprising: a frequency detector having an input port to receive the first clock and a feedback port to receive the second clock, the frequency detector comprising means to measure a frequency difference between the first clock rate and the second clock rate and to drive an impulse, wherein the impulse signal is positive ("up") if the difference is positive and negative ("down") if the difference is negative; and a number-controlled oscillator (NCO) configured to adjust the second clock frequency responsive to the impulse, wherein an output of the NCO provides the second clock.

Example 17 includes the SRC of example 16, wherein the second clock rate is a multiple or fractional value of the first clock rate.

Example 18 includes the SRC of example 16, wherein the frequency detector comprises a wrap detector to determine that an NCO counter has wrapped around.

Example 19 includes the SRC of example 16, wherein the circuitry to measure difference comprises an integrator to provide an increment controller.

Example 20 includes the SRC of example 16, wherein the PLL further comprises a phase adjust NCO circuit to adjust the phase of the output clock relative to the external frequency input.

Example 21 includes the SRC of example 20, wherein the phase adjust NCO is configured to adjust the output clock to 180 degrees relative to the external frequency input.

Example 22 includes the SRC of example 16, wherein the frequency detector is configured to provide a configurable gain k.

Example 23 includes the SRC of example 22, wherein the frequency detector operates with gain $k_0$ in an initialization mode, and further comprising a 1:1 detect circuit to determine that the frequency of the output clock matches the frequency of the external input for n cycles and to reduce the gain to $k_1$.

Example 24 includes the SRC of example 23, wherein the PLL further comprises an averaging filter disposed to gradually adjust between $k_0$ and $k_1$.

Example 25 includes the SRC of example 22, further comprising a lock detect circuit to determine that the second clock frequency is locked to the first clock frequency.

Example 26 includes the SRC of example 22, further comprising a control input to adjust k.

Example 27 includes the SRC of example 16, further comprising a bit select circuit to provide a multiple or fraction of the second clock.

Example 28 includes the SRC of example 16, further comprising a retimer to sample the external input at a local clock frequency.

Example 29 includes the SRC of example 16, wherein the SRC is an asynchronous SRC.

Example 30 includes the SRC of example 16, wherein the SRC is a bidirectional SRC.

Example 31 includes an intellectual property (IP) block comprising the SRC of any of examples 16-29.

Example 32 includes an integrated circuit comprising the SRC of any of examples 16-29.

Example 33 includes an audio device, comprising: an audio input to receive audio data at a first clock rate; an audio processor circuit to provide processed audio data, the audio processor circuit comprising signal conditioning circuitry to operate at a second clock rate, and a phase-locked loop (PLL), comprising: a frequency detector having a first input to sample the first clock rate and a feedback input to sample the second clock rate, the frequency detector comprising circuitry to measure a frequency difference between the first clock rate and the second clock rate and to drive an impulse, wherein the impulse signal is positive if the difference is positive and negative if the difference is negative; and a number-controlled oscillator (NCO) to adjust the second clock frequency responsive to the impulse, wherein an output of the NCO operates at the second clock rate; and a driver to drive the processed audio data.

Example 34 includes the audio device of example 33, wherein the second clock rate is a multiple or fractional value of the first clock rate.

Example 35 includes the audio device of example 33, wherein the frequency detector comprises a wrap detector to determine that an NCO counter has wrapped around.

Example 36 includes the audio device of example 33, wherein the circuitry to measure difference comprises an integrator to provide an increment controller.

Example 37 includes the audio device of example 33, wherein the PLL further comprises a phase adjust NCO circuit to adjust the phase of the output clock relative to the external frequency input.

Example 38 includes the audio device of example 37, wherein the phase adjust NCO is configured to adjust the output clock to 180 degrees relative to the external frequency input.

Example 39 includes the audio device of example 33, wherein the frequency detector is configured to provide a configurable gain k.

Example 40 includes the audio device of example 39, wherein the frequency detector operates with gain $k_0$ in an initialization mode, and further comprising a 1:1 detect circuit to determine that the frequency of the output clock matches the frequency of the external input for n cycles and to reduce the gain to $k_1$.

Example 41 includes the audio device of example 40, wherein the PLL further comprises an averaging filter disposed to gradually adjust between $k_0$ and $k_1$.

Example 42 includes the audio device of example 40, further comprising a lock detect circuit to determine that the second clock frequency is locked to the first clock frequency.

Example 43 includes the audio device of example 39, further comprising a control input to adjust k.

Example 44 includes the audio device of example 33, further comprising a bit select circuit to provide a multiple or fraction of the second clock.

Example 45 includes the audio device of example 33, further comprising a retimer to sample the external input at a local clock frequency.

Example 46 includes the audio device of example 33, wherein the SRC is an asynchronous SRC.

Example 47 includes the audio device of example 33, wherein the SRC is a bidirectional SRC.

Example 48 includes the audio device of example 33, wherein the audio input comprises an analog audio input.

Example 49 includes the audio device of example 33, wherein the audio input comprises a digital audio input.

Example 50 includes the audio device of example 33, wherein the audio input comprises a Bluetooth input.

Example 51 includes the audio device of example 33, wherein the audio input comprises a universal serial bus (USB) input.

Example 52 includes the audio device of any of examples 33-51, wherein the audio processor circuit comprises active noise cancellation (ANC).

Example 53 includes the audio device of any of examples 33-51, wherein the audio processor circuit comprises sound enhancement circuitry.

Example 54 includes a headphone comprising the audio device of example 52 or 53.

Example 55 includes an earbud comprising the audio device of example 52 or 53.

Example 56 includes a headset comprising the audio device of example 52 or 53.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system-on-a-chip (SoC) central processing unit (CPU) package. An SoC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. Any module, function, or block element of an ASIC or SoC can be provided, where appropriate, in a reusable "black box" intellectual property (IP) block, which can be distributed separately without disclosing the logical details of the IP block. In various other embodiments, the digital signal processing functionalities may be implemented in one or more silicon cores in application-specific integrated circuits (ASICs), field-programmable gate arrays (FPGAs), and other semiconductor chips.

In some cases, the teachings of the present specification may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of register transfer level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, the capacitors, buffers, graphics elements, interconnect boards, clocks, DDRs, camera sensors, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. A phase-locked loop (PLL) circuit, comprising:
    a frequency detector to drive an impulse signal by measuring a frequency difference between an external frequency input and a feedback frequency input, wherein the impulse signal is of a first species when the frequency difference is positive and is of a second species when the frequency difference is negative; and
    a number-controlled oscillator (NCO) comprising circuitry to drive an output clock and to adjust a frequency of the output clock responsive to the impulse signal, wherein the NCO is configured to adjust a selected input frequency in a frequency dimension by incrementing or decrementing its output clock by a quantum value based on a control signal.

2. The PLL circuit of claim 1, further comprising:
    an averaging filter to control a gain at which an increment controller operates, wherein the averaging filter is configured to signal the increment controller to reduce a gain based, at least in part, on determining a near lock on a given frequency of the PLL.

3. The PLL circuit of claim 1, wherein the NCO is a phase-adjusted NCO configured to calculate a phase difference between the output clock and an input clock in a phase dimension.

4. The PLL circuit of claim 1, further comprising:
    a multiplier block to generate a fixed multiple of composite frequencies; and
    a low-pass filter (LPF) to filter one or more oscillations, wherein the LPF is controlled by an external digital input.

5. The PLL circuit of claim 1, further comprising:
    an integrator to provide an increment controller, wherein a greater magnitude of an impulse from the frequency detector yields a greater output of the increment controller to cause the NCO to adjust its output frequency.

6. The PLL circuit of claim 1, wherein the NCO is configured to increment or decrement its clock frequency by a quantum amount based on the control signal.

7. The PLL circuit of claim 1, wherein an accuracy of the NCO is increased by reducing a gain associated with the frequency detector.

8. The PLL circuit of claim 1, wherein the frequency detector is configured to provide a low power mode (LPM) to operate the frequency detector at a selected internal clock frequency.

9. The PLL circuit of claim 1, further comprising a lock detect circuit to determine whether the output clock is locked to the external frequency input.

10. The PLL circuit of claim 1, wherein the frequency detector is further configured to:
    output a positive value or a negative value depending, at least in part, on whether the NCO count wraps first or a new pulse is received by the frequency detector.

11. The PLL circuit of claim 1, wherein the frequency detector is configured to operate in a fast mode to produce a high gain in seeking a target frequency.

12. The PLL circuit of claim 1, further comprising a retimer to sample the external frequency input at a local clock frequency.

13. The PLL circuit of claim 1, wherein an output of the NCO provides the feedback frequency input of the frequency detector.

14. An integrated circuit comprising the PLL of claim 1.

15. A sample rate converter (SRC) to re-clock an external signal to a local clock, comprising:
    an input port configured to receive input data from a first clock having a first clock rate;
    signal conditioning circuitry configured to operate from a second clock having a second clock rate; and
    a phase lock loop (PLL), comprising:
        a frequency detector having an input port to receive the first clock and a feedback port to receive the second clock, the frequency detector comprising means to measure a frequency difference between the first clock rate and the second clock rate and to drive an impulse signal, wherein the impulse signal is positive ("up") when the frequency difference is positive and negative ("down") when the frequency difference is negative; and
        a number-controlled oscillator (NCO) configured to adjust a clock frequency responsive to the impulse signal, wherein an output of the NCO provides the second clock, wherein the NCO is configured to adjust a selected input frequency in a frequency dimension by incrementing or decrementing its output clock by a quantum value based on a control signal.

16. An audio device, comprising:
    an audio input to receive audio data at a first clock rate;
    an audio processor circuit to provide processed audio data, the audio processor circuit comprising signal conditioning circuitry to operate at a second clock rate, and a phase-locked loop (PLL), comprising:
        a frequency detector to drive an impulse signal by measuring a frequency difference between an external frequency input and a feedback frequency input, wherein the impulse signal is of a first species when the frequency difference is positive and is of a second species when the frequency difference is negative;
        a number-controlled oscillator (NCO) comprising circuitry to drive an output clock and to adjust a frequency of the output clock responsive to the impulse signal; and
    a driver to drive the processed audio data, wherein the NCO is configured to adjust a selected input frequency in a frequency dimension by incrementing or decrementing its output clock by a quantum value based on a control signal.

17. The audio device of claim 16, wherein the audio processor circuit comprises active noise cancellation (ANC).

18. The audio device of claim 16, further comprising:
a multiplier block to generate a fixed multiple of composite frequencies; and
a low-pass filter (LPF) to filter one or more oscillations, wherein the LPF is controlled by an external digital input.

19. The audio device of claim 16, further comprising:
an averaging filter to control a gain at which an increment controller operates, wherein the averaging filter is configured to signal the increment controller to reduce a gain based, at least in part, on determining a near lock on a given frequency of the PLL.

20. The audio device of claim 16, wherein the audio device comprises a noise canceling headset that includes a driver to drive an audio waveform.

* * * * *